United States Patent [19]

Brown, Sr. et al.

[11] Patent Number: 5,023,915
[45] Date of Patent: Jun. 11, 1991

[54] SPECIALIZED AMPLIFIER SYSTEMS FOR MUSICAL INSTRUMENTS

[75] Inventors: James W. Brown, Sr.; Jack C. Sondermeyer, both of Meridian, Miss.

[73] Assignee: Peavey Electronics Corporation, Meridian, Miss.

[21] Appl. No.: 397,875

[22] Filed: Aug. 24, 1989

Related U.S. Application Data

[63] Continuation of Ser. No. 142,020, Jan. 11, 1988, Pat. No. 4,890,331.

[51] Int. Cl.[5] .......................... H03F 1/34; H03G 3/02
[52] U.S. Cl. .................................. 381/120; 381/123; 381/61
[58] Field of Search ................. 381/120, 123, 61, 62, 381/63, 81, 84, 104; 455/338, 341

[56] References Cited

U.S. PATENT DOCUMENTS 2,489,008 11/1949 Callender ............................ 381/80
2,492,542 11/1949 Stone ................................... 381/120
4,211,893 7/1980 Smith .................................. 381/120
4,481,660 11/1984 De Koning ........................ 381/120
4,701,957 10/1987 Smith .................................. 381/61

Primary Examiner—Tommy P. Chin
Attorney, Agent, or Firm—Watson, Cole, Grindle & Watson

[57] ABSTRACT

Separate audio amplifier channels are provided with separate input signal level controls so that the output of one channel is unaffected by the input signal level of the other channel, and vice versa. A switch controls selection of the desired channel. Three channels also be provided and first and second switches control selection of any one of the three channels. As before, separate input signal level controls are provided for the three channels so that each is unaffected by the signal level control of either of the others. Two channels may be distortion channels, each with an input level control and also with an output level control. One channel may be a clean sound channel.

9 Claims, 2 Drawing Sheets

SPECIALIZED AMPLIFIER SYSTEMS FOR MUSICAL INSTRUMENTS

CROSS-REFERENCE TO RELATED APPLICATION

This application is a continuation of Ser. No. 142,020 filed Jan. 11, 1988 now U.S. Pat. No. 4,890,331 in the name of James W. Brown, Sr. and Jack C. Sondermeyer and assigned to Peavey Electronics Corporation the assignee herein.

BACKGROUND OF THE INVENTION

This invention relates to specialized amplifier systems for musical instrumentation, particularly for guitars, although its use is not limited thereto.

In performing contemporaneous popular music such as rock music, blues and the like, wherein the ensemble includes an electric lead instrument such as a guitar which at times may be playing a "background" or chordal line and, at other times, a solo or lead line, it has become customary for such instrument to be amplified differently for these two modes. In addition, it has been customary to provide for reverberation in either of these two modes. The solo line is normally referred to as the lead mode and the chordal line is normally referred to as the rhythm mode and for consistency, these terms will be used herein.

The rhythm mode refers to amplification which produces a relatively "clean" sound for the instrument in question, i.e., one which is free or substantially free of distortion; and the lead mode refers to amplification involving distortion of the sound of the instrument.

In the prior art, as exemplified for example by FIG. 1 of this application, the amplifier system comprises a series of cascaded amplifier stages for the rhythm mode and providing a "Volume I" potentiometer control at or near the input end of the cascaded stages and a "Master I" potentiometer control at the output of the final stage of the rhythm mode cascade. The amplifier system is switchable to the lead mode by switching in a further, distortion amplifier stage to the rhythm mode cascaded stages (while switching out the "Master I" control), such further stage having a "lead drive" potentiometer control at the input to the distortion stage and a "lead master" potentiometer control as the output of the distortion stage. As is conventional, the distortion stage comprises one or more high gain amplifiers operated non-linearly to provide generation of a composite signal in which half or more of the signal content may be distortion products (mostly even harmonics together with a substantial amount of odd harmonics).

Amplifier systems of this type have been very successful, but are sometimes difficult to use because the two modes are not independent. That is, the "Volume I" control sets the initial gain for both modes (or for further modes such as added reverberation or a preset attenuation of the lead mode) and this dependency makes it impossible always to obtain the desired output volumes for both a rhythm mode sound and for a lead mode sound. That is, for a very clean rhythm mode sound, the "Volume I" control must be set sufficiently low as to assure that the cascaded stages of the rhythm mode do not distort the audio signal input. This limits the maximum or full tilt distortion which may be produced in the lead mode. In consequence, some degree of compromise must be effected when setting the various interrelated volume controls. For example, assuming a very clean rhythm mode sound is to be achieved, this means that the "Volume I" control must be set to a relatively low value. If, now, a high degree of distortion is desired in the lead mode, it is limited by the setting of the "Volume I" control and the output volume of this limited distortion is likewise limited by the "Volume I" setting.

Consequently, this invention is directed to improvements in such amplifier systems.

BRIEF SUMMARY OF THE INVENTION

Basically, this invention concerns an amplifier system for musical instruments which offers greater flexibility and opportunity for attaining the precise sounds and volumes thereof as may be desired by a particular performer, and which may be altered and adjusted over a wide range.

One object of this invention concerns an amplifier system for musical performers embodying the combination of distortion amplifier means for receiving a performer's audio signal input and providing separate output channel signals which are distorted and amplified with respect to the performer's input, first means set for the performer and including first and second adjustable distortion level controls for the separate output channels to control the level of distortion of the audio signal input, second means set for the performer and including first and second post-distortion controls for the separate output channels to control the volume of distortion of the performer's audio signal input, and switching means for selectively switching between the separate channels to provide respective distortion signals in which both distortion level and post-distortion volume level may be different for the same audio input signal.

In another aspect, this invention relates to a system as above which also utilizes means for adapting the frequency response of the system usefully for distortion.

Another object of this invention is to provide a specialized amplifier system for musical instruments having an audio signal input terminal and an amplified audio signal output terminal, which comprises the combination of rhythm mode amplification means connected to the input terminal for producing an amplified clean sound channel from the input terminal to the output terminal and including a plurality of amplifier stages in cascade, lead mode amplification means connected to the input terminal for producing an amplified distorted sound channel from the input terminal to the output terminal and including a plurality of amplifier stages in cascade, and switching means for selectively connecting the input terminal to the output terminal in either of the channel configurations, the rhythm mode amplification means having an adjustable input signal level control which is confined to the amplified clean sound channel and the lead mode amplification means having an adjustable input signal level control and an adjustable volume level control which are confined to the amplified distorted sound channel whereby the rhythm and lead modes are independently controllable.

Another object of this invention is to provide a system as above wherein the cascaded amplifier stages of the two channels share common pre-amplifier means and common output amplifier means; wherein the switching means includes switches selecting one of two amplified distorted sound channels; and wherein the two amplified distorted sound channels are provided with separate distortion level and output volume controls.

Another object of this invention is to provide a specialized audio amplifier system for a performer's audio signal input during musical performances, which comprises the combination of three separate amplifier channels comprising first amplifier means for providing a substantially undistorted and amplified rhythm mode channel signal representing the audio input signal, and second amplifier means for providing a plurality of separate distortion lead mode channel signals each of which is distorted and amplified with respect to the audio input signal, and switching means for selecting any one of the three channels as a selected output of the amplifier means while independently setting levels thereof.

A further object of this invention is to provide the combination of a preamplifier stage of amplification having an input terminal for receiving audio signal input from the musical instrument, clean stage amplification means for providing an amplified clean channel output signal and having clean channel audio signal level control means at its input, output amplification means for providing an amplified output signal, distortion amplifier means for producing a distorted, amplified output signal, first switching means for selectively (1) connecting the preamplifier stage, the clean stage amplification means and the output amplification means in cascade to produce an amplified clean channel output signal from the output amplification means in the substantial absence of distortion and whose volume is controlled by the clean channel volume control means and (2) connecting the preamplifier stage, the distortion amplifier means and the output amplification means in cascade to provide a distorted signal input to the output amplification means, and second switching means for controlling both the distortion level of the distortion amplification means and the volume level of output from the distortion amplifier means.

In accord with the preceding object, the system includes first and second adjustable distortion level controls and first and second output volume controls, the second switching means selecting either the first adjustable distortion level control with the first adjustable output volume control or the second adjustable distortion level control with the second adjustable output volume control.

In one aspect, the invention relates to an amplifier system for musical instruments which comprises the combination of a preamplifier stage of amplification having an input terminal for receiving audio signal input from the musical instrument, clean stage amplification means for providing a clean channel output signal and having clean channel input signal level control means at its input, output amplification means for providing an amplified output signal, distortion amplifier means for producing a distorted output signal, first switching means for selectively (1) connecting the preamplifier stage, the clean stage amplification means and the output amplification means in cascade to produce a clean channel output signal from the output amplification means and (2) connecting the preamplifier stage, the distortion amplifier means and the output amplification means in cascade to provide a distorted signal input to the output amplification means, and second switching means for controlling both the volume level of input to the distortion amplification means and the volume level of output from the distortion amplifier means.

In accord with the preceding object, a further objective is to provide an amplifier system as above including first and second adjustable input signal level controls and first and second adjustable output volume controls for the distortion amplifier means, the second switching means selecting either the first adjustable input signal level control with the first adjustable output volume control or the second adjustable input signal level control with the second adjustable output volume control.

In another aspect, the invention relates to the combination of distortion amplifier means for musical instruments having an input terminal for receiving an audio signal from the instrument and an output terminal at which the audio signal in distorted form is produced, first means for providing at least two input channels to the input terminal of the distortion amplifier means, second means for providing at least two output channels from the output terminal of the distortion amplifier means, the first means including first and second adjustable distortion level controls and the second means including first and second adjustable volume level controls, and switching means for selectively (1) connecting the first adjustable distortion level control to the input terminal of the distortion amplifier means and the first adjustable adjustable volume level control to the output terminal or (2) connecting the second adjustable input signal level control to the input terminal of the distortion amplifier means and the second adjustable volume level adjustable control to the output terminal of the distortion amplifier means.

Stated otherwise, an object of this invention is to provide an amplifier system of the nature stated which is capable of being set to three independent output modes, a rhythm mode and two lead modes which are different from each other.

In another aspect, the invention is directed to a novel lead mode amplification system which lends greater flexibility, choice and independence to the performer. Two, or even more, lead amplification modes are made possible by this invention, each having its own distinctive level of distortion and of output volume each as chosen and set by the performer.

In another aspect, the invention relates to a distortion amplifier system for musical instruments, the combination of distortion amplifier means for receiving an audio signal from the instrument and having at least two distorted/amplified channels including first and second adjustable signal level controls and first and second adjustable volume level controls, and switching means for selecting a desired channel.

These and further features and advantages of the invention will become more apparent as this description proceeds.

BRIEF DESCRIPTION OF THE DRAWING FIGURES

FIG. 1 is a schematic diagram illustrative of prior art;
FIG. 2 is a schematic diagram of this invention;
FIG. 3 is a circuit diagram illustrating one form which the distortion stage may take; and
FIG. 4 is a circuit diagram of another form which the distortion stage may take.

DETAILED DESCRIPTION OF THE INVENTION

Figure 1:
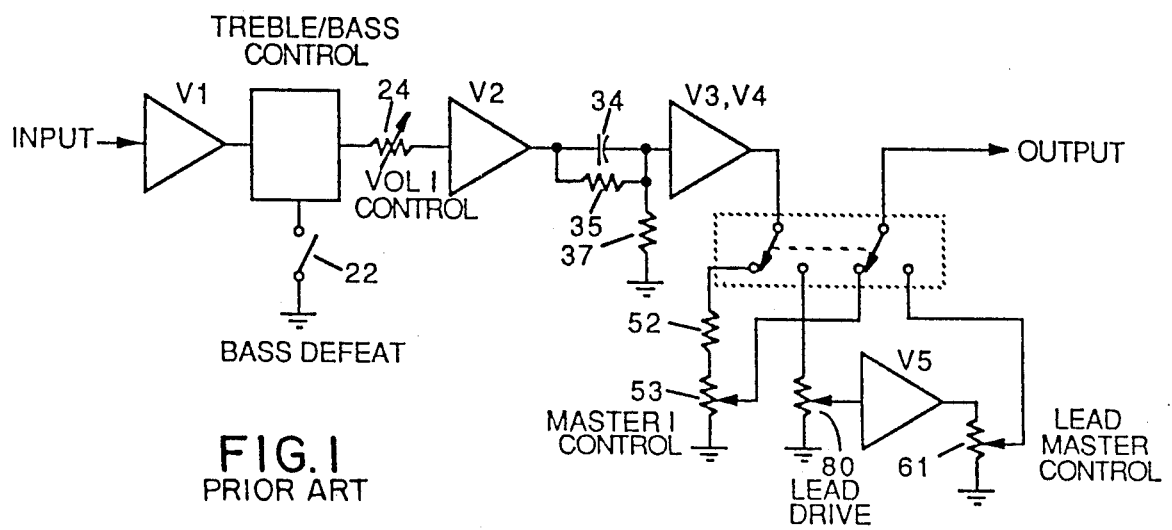

With reference to FIG. 1, an amplifier system in accord with the prior art is illustrated. The amplifier stage V1 comprises an input preamplifier whose output is fed through the treble/bass control which may have a bass defeat 22 and the "Volume I" potentiometer 24 to the input of the stage V2 whose output is applied through the RC network 34, 35 and the grounding resistor 37 for tone shaping to the stages V3 and V4. These cascaded amplifier stages are associated with the illustrated switching means which either switches the output of the cascaded stages V1–V4 to the output terminal through the attenuating resistor 52 and the "Master I" potentiometer 53 or through the "Lead Drive" potentiometer 80 to switch in the distortion stage V5, having its own output volume control in the form of the "Lead Master" potentiometer 61. This system, it will be noted, produces a rhythm mode at the output of the stages V1–V4 and a lead mode at the output of the stages V1–V5, with the "Volume I" control determining and setting the input signal level for both modes. Thus, although a performer may manually set or select any one or all of the controls 16, 21, 24, 61 or 80 illustrated prior to a particular performance and remotely select either rhythm or lead mode at will (e.g., through a foot switch), it is not practical also to reset any of the controls 16, 21, 24, 61 or 80 during a performance. For this reason, there are distinct limitations on the variations in sounds which may be effected through operation of the foot switch alone. For example, if the performer desires a very clean rhythm mode sound he is limited by the setting of the "Volume I" control, else the clean stages V2–V4 may introduce unwanted distortion. Then, when switching to the lead mode, its sound is affected by the setting of the "Volume I" control as well and, for this reason, no setting of the "Lead Drive" control may be effective to introduce the desired degree of distortion. Further, no setting of the "Lead Master" control may be available for attaining the desired level of output from the lead mode.

Figure 2:
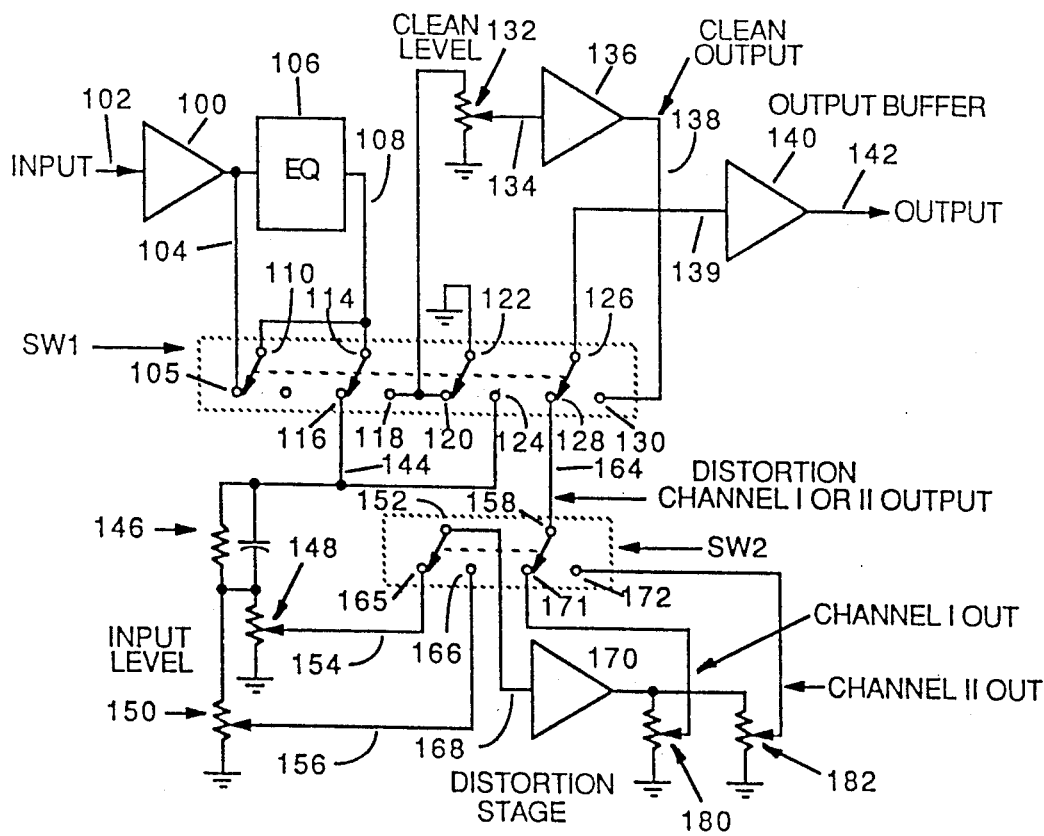

In accord with this invention, as illustrated in FIG. 2, complete independence between rhythm and lead modes is attained. As illustrated, the initial or preamplifier stage 100 is provided with the input terminal 102 to which the audio signal is applied and its output 104 is connected with one contact 105 of the four pole, double throw relay or switch SW1 while the output through the equalizing circuit 106 is connected through the line 108 to the pole 110. The connection through the line 112 is also made to the second pole 114. The switch SW1 as shown is in position connecting the amplifier system in lead mode. By conventional foot or other remote switch control, the switch SW1 is actuated from the position shown to position in which the connections between the pole 110 and the contact 105 is broken; the connection between the pole 114 and the contact 116 is broken while that between the pole 114 and the contact 118 is made; connection between the pole 122 and the contact 120 is broken while that between the pole 122 and the contact 124 is made; and, finally, connection between the pole 126 and the contact 128 is broken while that between the pole 126 and the contact 130 is made. In this position, the line 108 from the frequency response circuit 106 is connected through the path 112, 114, 118 to the "clean level" potentiometer 132 to provide a selected level of input signal at the conductor 134 to drive the clean stage amplifier means 136. The switching means SW1 also connects the pole 126 to the contact 130 which is connected to the conductor 138 at which the amplified output of the amplifier means 136 is connected through the input line 139 to the output buffer stage of amplification at 140. Thus, in this position of the switching means SW1, the rhythm mode output signal appears at the conductor 142. It is to be noted that in the rhythm mode, the frequency response circuit 106 is used whereas in the lead modes, it is not. Instead, frequency response means in the form of the filter circuit 146 is switched in in the lead modes and this feature further provides independence between the rhythm and lead modes. That is, the frequency response circuit 106 is constructed to allow the most propitious selection of frequencies passed to the clean channel whereas separate selection at the separate frequency response circuit 146 is made whenever the lead modes are switched in. The capacitor/resistance selection in the circuitry 146 is such as to eliminate "muddy" lower frequency sounds so as not to create "metallic" higher frequency sounds due to distortion and amplification of the signal passing the frequency response circuit 106 and it is for this reason that the output of the preamplifier 100 is connected to the contact 105 of the switching means SW1. In general, it may be said that the circuitry 146 spreads the separation between and among harmonic frequencies passed to the distortion stages so as to attenuate those which might lead to the aforesaid "muddy" or "metallic" tones.

When the switching means SW1 is in the position illustrated in full lines in FIG. 2, the preamplified signal is directed to the conductor 14 connected with the contact 116 and feeds through the frequency response means 146 either through the potentiometer 148 or the potentiometer 150, dependent upon the position of the second switching means SW2. The switching means SW2 is preferably a double pole, double throw relay, remotely controlled by the performer as by a foot actuated switch. The potentiometer 148 is the "distortion channel I" adjustable input signal level control and the potentiometer 150 is the "distortion channel II" adjustable input signal level control. The pole 152 switches between connecting the input line 154 of Channel I to the input line 168 of the distortion amplifier means 170 and the input line 156 of Channel II to the input line 168, whereas the pole 158 switches between connecting the Channel I distorted output on the line 160 through the contact 171, pole 158, line 164, contact 128 and pole 126 to the input line 139 of the output buffer stage 140, and the distorted output line 162 of Channel II through the contact 172 and pole 158 to the input line 139, as before.

The levels of distortion are set by the adjustable input signal level means 148 and 150 and the levels of these distorted signal are set by the adjustable input signal level means 180 and 182 for application to the output stage 140. It is preferred that the two adjustable input signal level means 148 and 150 be different so that each setting thereof (which may be by ascending numbers in each case) is different for the same numerical setting for the two means. In this way, the performer may initially set the two adjustable input signal levels to the same numerical levels while being assured, say, that Channel I adjustable input signal level is less than Channel II adjustable input signal level (assuming that Channel I lead mode should normally if not always have less total distortion than Channel II lead mode). Similarly for the two adjustable volume level means 180 and 182, assuming, say, that Channel I lead mode volume is normally if not always to be less than Channel II lead mode volume.

Figure 3:
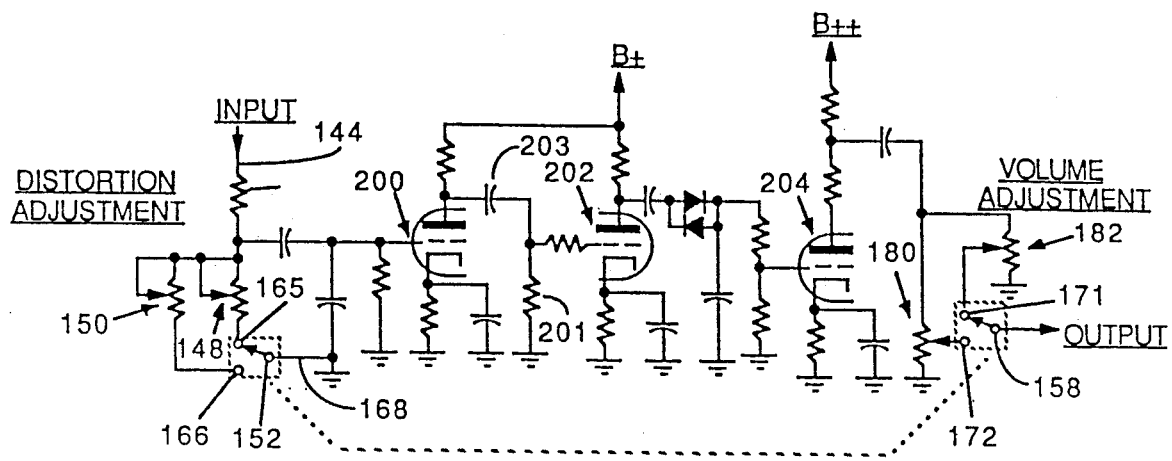

With reference to FIG. 3, a two channel vacuum tube type distortion amplifier system is illustrated. As shown, the amplifier is of the class A tube type and since this type of amplifier is well known to those skilled in the art, specific details are not included except as to the manner of providing the optional adjustable input signal level audio signal inputs 148 and 150 and the corresponding adjustable volume level volume controls 180 and 182. Suffice it to say that the tube half may for example be ½ of a 12AX7, the other half of which may form the output buffer amplifier stage 140 of FIG. 2. The tubes 202 and 204 may form the two halves of another 12AX7. The two adjustable input signal levels are voltage divided across the resistor 206 and the respective one of the two potentiometers 148 or 150 (but specifically different from the voltage division effected in FIG. 2) and control the amplification gain of the audio input signal before it is clipped by voltage swing limitations (on tube amplifiers), diodes (in most solid state amplifiers) or some other clipping means.

In FIG. 3, the voltage division obtains the large gains necessary to exceed the maximum possible voltage swings at each tube's output as well as the inputs. Clipping is effected between the supply and ground rails.

In FIG. 3, it is to be noted that the line 144 of FIG. 2 forms the input to the circuit illustrated and, thus, this circuit omits the frequency response circuit 146 of FIG. 2. Instead, the desired frequency response, as noted above, is achieved by the high pass filter circuit combination of the capacitor 203 and grounded resistor 201 connected to the plate terminal of the tube stage 200.

Figure 4:
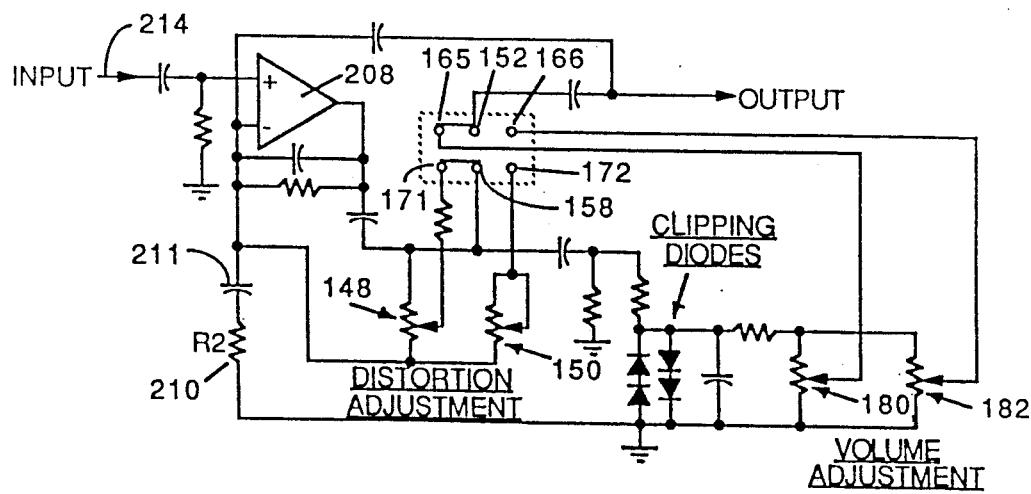

In FIG. 4, distortion is effected by the solid state operational amplifier 208 which may for example be a type MC 4558. The gain of this operational amplifier is defined by the adjusted feedback resistance around the operational amplifier and defined in part by the value R2 of the resistor 210. In accord with the well-known formula $A_v = 1 + (Rf/R2)$, where Rf is the total equivalent resistance in the feed back path of the amplifier, the alternate switching of the potentiometers 148 or 150 will establish independent gains for the operational amplifier, but, in contrast to FIGS. 2 and 3, the input at 214 to the distortion amplifier is of fixed level. Thus, the levels of distortion are not effected in an adjustable input signal level manner as in the other FIGS. 2 and 3, but internally of the distortion amplifier stage.

In all of the circuits of this invention, it is of interest to note that if the two potentiometers 148 and 150 in each case are made of different total values and the same proportionate setting levels, say from 0 to 9, are used in each, the same settings on each will automatically establish two different adjustable input signal level levels. This makes it easier for the performer to dial in the desired levels of adjustable input signal level for each of the two lead mode channels.

It is also to be noted that the two distortion channel simulations of FIGS. 3 and 4 are particularly useful in other and different configurations, as, for example, in the general configuration disclosed in our copending application Ser. No. 063,924, filed 06/19/87 and entitled SUPERDISTORTED AMPLIFIER CIRCUITRY WITH NORMAL GAIN.

In considering this invention, the above disclosure is intended to be illustrative only and the scope and coverage of the invention should be construed and determined by the following claims.

What is claimed is:

1. An amplifier system having an audio signal input terminal and an amplified audio signal output terminal, which comprises the combination of rhythm mode amplification means connected to the input terminal for producing an amplified clean sound channel from the input terminal to the output terminal and including a plurality of amplifier stages in cascade, lead mode amplification means connected to the input terminal for producing an amplified and clipped sound channel from the input terminal to the output terminal and including a plurality of amplifier stages in cascade, and switching means for selectively connecting the input terminal to the output terminal through either the amplified clean sound channel or through the amplified and clipped sound channel, the rhythm mode amplification means having adjustable input audio signal level control means which is confined to the amplified clean sound channel for independently adjusting only the input audio signal level of the amplified clean sound channel and the lead mode amplification means having (1) adjustable input signal level control means for independently adjusting only the input audio signal level of the amplified and clipped sound channel and (2) adjustable audio signal volume control means for independently adjusting only the output signal level of the amplified and clipped sound channel and which are confined to the amplified and clipped sound channel whereby the amplified clean sound channel and the amplified and clipped sound channel are independently controllable with respect to each other.

2. An amplifier system as defined in claim 1 wherein the cascaded amplifier stages of the amplified clean sound channel and the amplified and clipped sound channel share common pre-amplifier means and common output amplifier means.

3. An amplifier as defined in claim 1 wherein the lead mode amplification means produces two amplified and clipped sound channels and second switching means for selecting one of the two amplified and clipped sound channels.

4. An amplifier system as defined in claim 3 wherein the two amplified and clipped sound channels are both provided with separate adjustable input signal level control means and adjustable volume level control means.

5. An amplifier system which comprises the combination of a preamplifier stage of amplification having an input terminal for receiving audio signal input, clean stage amplification means for providing an amplified clean channel output signal and having clean channel audio signal level control means at its input for independently setting only the signal level input to the clean stage amplification means, output amplification means for providing an amplified output signal, distortion amplifier means for producing a clipped, amplified channel output signal, first switching means for selectively (1) connecting the preamplifier stage, the clean stage amplification means and the output amplification means in cascade to apply said amplified clean channel output signal as the input to the output amplification means and (2) connecting the preamplifier stage, the distortion amplifier means and the output amplification means in cascade to apply said clipped, amplified channel output signal as the input to the output amplification means, and second switching means for controlling both the signal level of input to the distortion amplification means and the volume level of output from the distortion amplifier means.

6. An amplifier system as defined in claim 5 including first and second adjustable input signals level controls and first and second adjustable output volume controls, the second switching means selecting either the first adjustable input signal level control with the first adjustable volume level control or the second adjustable input signal level control with the second adjustable volume level control for controlling the clipping level and output volume of said clipped, amplified channel output signal.

7. In a distortion amplifier system, the combination of distortion amplifier means having an input terminal for receiving an audio signal and an output terminal at which the audio signal in clipped form is produced, first means for providing at least two independent input channels to the input terminal of the distortion amplifier means for providing said audio signal, second means for providing at least two independent output channels from the output terminal of the distortion amplifier means for providing at least two audio signals in clipped form, the first means including first and second adjustable input signal level control means for independently adjusting the input signal levels of the two independent output channels and the second means including first and second adjustable volume level control means for independently adjusting the output volumes of the two independent output channels, and switching means for selectively (1) connecting the first adjustable input signal level control means to the input terminal of the distortion amplifier means and the first adjustable volume level control means to the output terminal or (2) connecting the second adjustable input signal level control means to the input terminal of the distortion amplifier means and the second adjustable volume level control means to the output terminal of the distortion amplifier means.

8. In a distortion amplifier system, the combination of distortion amplifier means for receiving an audio signal input and providing separate output channel signals which are clipped and amplified with respect to the audio signal input, first and second adjustable distortion level control means for the separate output channel signals to independently control the levels of clipping of the audio signal input, first and second post-distortion control means for the separate output channel signals to independently control the volumes of clipping of the audio signal input, and switching means for selectively switching between the separate output has been channel signals to provide respective clipped signals in which both clipping level and post-clipping volume of a respective clipped signal may be set differently for the same audio input signal.

9. An audio amplifier circuit having an audio signal input terminal and an amplified audio signal output terminal, which comprises a combination of first amplifier channel means for receiving an audio signal input and producing a first amplified audio output signal, said first amplifier channel means including control means for variably setting at least the volume of the first amplified audio output signal of the first amplifier channel means; second amplifier channel means for receiving said audio signal input and producing a second amplified audio output signal, said second amplifier channel means including control means for variably setting at least the volume of the second amplified audio output signal of the second amplifier channel means; and switch means having a first position for connecting the first amplifier channel means between the audio signal input terminal of the audio amplifier circuit and the amplified audio signal output terminal of the audio amplifier circuit and a second position for connecting the second amplifier channel means between the audio signal input terminal of the audio amplifier circuit and the amplified audio signal output terminal of the audio amplifier circuit whereby at least the volume of the amplified audio signal output at the audio signal output terminal of the audio amplifier circuit is dependent upon the position of the switch means; and wherein:

the first amplifier channel means produces a clipped, first amplified audio output signal and the second amplifier channel means produces a clipped, second amplified audio output signal.

* * * * *